(12) United States Patent
Kuwamura

(10) Patent No.: US 6,920,599 B2
(45) Date of Patent: Jul. 19, 2005

(54) STORAGE DEVICE AND ERROR CORRECTION METHOD THEREOF

(75) Inventor: Nobuhiro Kuwamura, Odawara (JP)

(73) Assignee: Hitachi Global Storage Technologies Japan, Ltd., Kanagawa-Ken (JP)

(*) Notice: Subject to any disclaimer, the term of this patent is extended or adjusted under 35 U.S.C. 154(b) by 461 days.

(21) Appl. No.: 10/067,335

(22) Filed: Feb. 7, 2002

(65) Prior Publication Data

US 2003/0066017 A1 Apr. 3, 2003

(30) Foreign Application Priority Data

Sep. 28, 2001 (JP) .......................... 2001-301512

(51) Int. Cl.$^7$ .......................... G11C 29/00; G06F 11/08
(52) U.S. Cl. .......................... 714/769; 714/797
(58) Field of Search .......................... 714/769, 770, 714/771, 797

(56) References Cited

U.S. PATENT DOCUMENTS

| | | | | |
|---|---|---|---|---|
| 5,321,703 A | * | 6/1994 | Weng | .......................... 714/797 |
| 5,701,314 A | * | 12/1997 | Armstrong et al. | .......... 714/765 |
| 6,092,231 A | * | 7/2000 | Sze | .......................... 714/758 |
| 6,332,204 B1 | * | 12/2001 | Russell | .......................... 714/710 |
| 6,427,215 B2 | * | 7/2002 | Rafanello et al. | ............ 714/710 |

FOREIGN PATENT DOCUMENTS

| | | |
|---|---|---|
| JP | 6-20403 | 1/1994 |
| JP | 2000-100086 | 4/2000 |

* cited by examiner

*Primary Examiner*—Joseph D. Torres
(74) *Attorney, Agent, or Firm*—Mattingly, Stanger, Malur & Brundidge, P.C.

(57) ABSTRACT

Positions in which errors have occurred are found more accurately and erasure correction is performed more effectively than in cases where TA flags or error flags issued by the R/W channel are utilized as information indicating the positions in which errors have occurred, [this being accomplished] by reading the same sector on the magnetic disk a plurality of times, storing the plurality of NRZ data thus obtained, comparing these NRZ data in byte units, judging that an error has occurred in byte positions where the NRZ data reproduced in each read operation differs, and utilizing these positions as erasure pointers for erasure correction.

8 Claims, 6 Drawing Sheets

STORAGE DEVICE AND ERROR CORRECTION METHOD THEREOF

BACKGROUND OF THE INVENTION

1. Field of the Invention

The present invention relates to an error correction method that is performed in cases where read errors are generated in a magnetic disk drive.

2. Description of the Related Art

The recording density of magnetic disk drives has been increasing year by year. Consequently, in cases where defects of the same magnitude are present on [recording] media, the errors that are generated have begun to appear as relatively greater error lengths. In cases where large errors are generated, a simple means which allows the detection and correction of such errors is an increase in the error correction code that is added to the data. However, this method suffers from the following vicious circle: namely, the formatting efficiency drops, so that the recording density must be raised even further.

Namely, in cases where data is written with a (2×n) byte Reed-Solomon code added as an error correction code, n bytes are used to specify the error position; accordingly, the error correction capacity is a maximum of n bytes. Consequently, if data is written with a (4×n) byte Reed-Solomon code added, then errors up to a maximum of (2×n) bytes can be corrected. However, the data recording capacity is reduced by an amount corresponding to the (2×n) byte increase. Accordingly, if the recording density is increased in order to compensate for this decrease, there is a corresponding increase in the generation of errors, so that the merit obtained by increasing the correction capacity is correspondingly diminished.

A method known as the erasure method is available as a method that improves the correction capacity without changing the length of the error correction code that is added.

Figure 2:
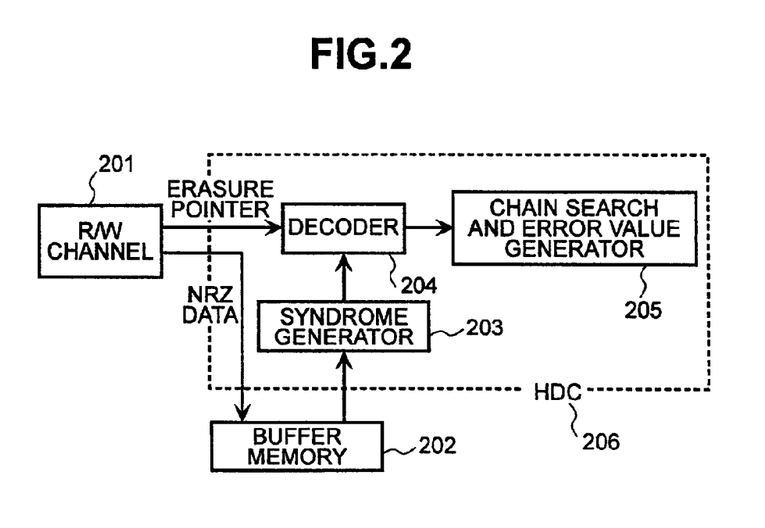
FIG. 2 is a diagram which shows the construction of a conventional magnetic disk drive that has an erasure correction function.

FIG. 2 shows the system construction used in a case where erasure correction is applied. The area surrounded by a broken line is generally provided as the function of an HDC 206 (hard disk controller).

The NRZ data reproduced by the R/W channel 201 is usually accumulated temporarily in a buffer memory 202. A syndrome is produced by a syndrome generator 203 from NRZ data that is extracted from the buffer memory 202 by the HDC. The decoder 204 produces an erasure-locator polynomial from an erasure pointer that indicates the error position.

TA flags or error flags issued by the R/W channel are utilized in order to specify error positions.

The TA flag is a flag that detects the positions of errors by thermal asperity (=TA). TA refers to a phenomenon that is measured in cases where a magnetic resistance effect (MR) element is used in the read head. An MR element shows a variation in resistance in cases where the temperature of the element rises as a result of friction caused by contact with projections on the magnetic disk; accordingly, this a phenomenon in which an abnormal amplitude resulting from the variation in resistance caused by heat is superimposed on the intrinsic signal component.

Figure 3:
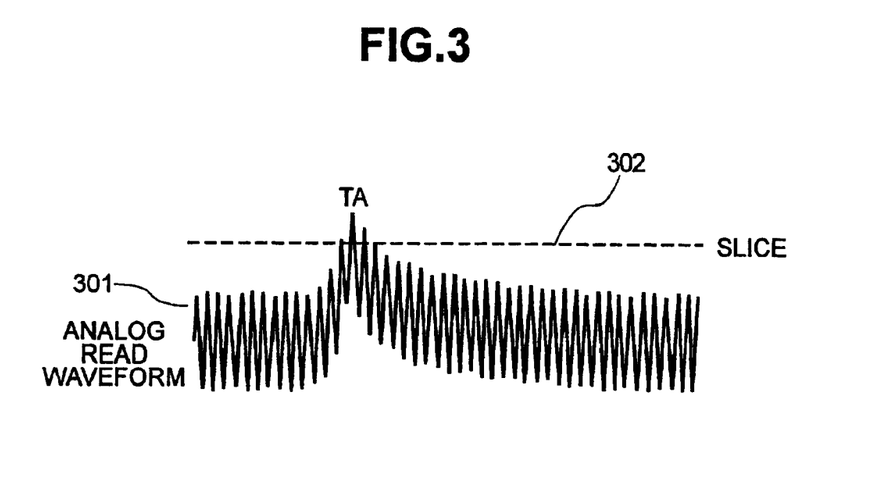
FIG. 3 is a diagram illustrating the detection of TA from the analog read waveform.

As is shown in FIG. 3, the amplitude of the analog read waveform 301 from the head that is input into the R/W channel via the R/W amplifier is monitored. In cases where a signal amplitude that exceeds a certain slice 302 is detected by this monitoring, TA is present in this position, and it is therefore possible to infer that an error has been generated.

Furthermore, as indicated by the name, the error flag is a flag that is issued in areas where there is a possibility that an error has been generated. This error flag [functions as follows:] specifically, the discrepancy between the expected ideal signal that should be input into the data playback circuit of the R/W channel in cases where the NRZ data that is decoded from the analog read waveform is correct and the signal that is actually input into the R/W channel is monitored, and in cases where this discrepancy is large, the error flag indicates the possibility that an error has been generated in this position. This error flag is issued by the R/W channel.

In addition to erasure correction using such a flag issued by the R/W channel, a method in which the error correction code is formed as a multiple code, and errors in the error correction code are allowed by a multi-decision circuit as indicated (for example) in Japanese Patent Laid-Open No. H6-20403, and a method in which the error generation position is hypothetically set and erasure correction is performed by varying this position as indicated in Japanese Patent Laid-Open No. 2000-100086, have also been considered.

Once the error position has been determined by TA or the like, a modified error-locator polynomial is produced from the syndrome and the erasure-locator polynomial. Then an error-magnitude polynomial $\omega(x)$ is produced from the modified error-locator polynomial. Finally, the chain search and error [value] generator 205 performs a chain search for the error-locator polynomial in order to detect the error position, and the error magnitude is determined by calculating the error-magnitude polynomial and modified error-locator polynomial.

In the modified error-locator polynomial, the number of unknown values used to specify the error position is smaller than in the abovementioned error-locator polynomial; accordingly, in a case where the same number of errors is generated, the probability that the errors can be corrected is higher. Consequently, in cases where erasure correction is applied, and data is written with a (2×n) byte Reed-Solomon code added, it is possible to correct errors up to a maximum of (2×n) bytes.

SUMMARY OF THE INVENTION

In cases where error positions are estimated using a TA flag, it is necessary to set the level of the slice in an appropriate manner in order to increase the precision. It is advisable to set the level of the slice on the low side in order to ensure reliable detection of TA in positions where TA is present. However, if the level of the slice is set too low, there is a possibility that the erroneous detection of TA, i.e., a rise of the TA flag, may occur in cases where noise is superimposed on the read signal. Since the magnitude of TA also varies according to the shape of the projections on the disk, the setting of the slice at an appropriate level so that no TA is missed, and so that there is at the same time no erroneous detection, is a difficult operation.

Furthermore, error propagation occurs when digital data is decoded from the analog read waveform. Accordingly, even assuming that the position of TA is correctly detected, it is difficult to make a correct estimate of the actual range of error in the decoded digital data using this TA.

The [abovementioned] error flag can detect locations where there appear to be abnormalities, not only by means of TA but also in terms of magnetic recording. Accordingly, this flag is more effective than a TA flag for estimating error positions. However, as in the case of a TA flag, the problems of missed error detection and erroneous detection occur unless the slice level of the equalized discrepancy at which the flag is issued is appropriately set.

Furthermore, in a method in which erasure correction is performed by varying a hypothetical error generation position in a comprehensive manner as in the technique described in Japanese Patent Laid-Open No. 2000-100086, the probability that the hypothetical error position will hit an actual error position is fairly low in cases where errors consisting of various numbers of bytes are dispersed in a plurality of positions.

In the present invention, means for estimating error positions utilizing the NRZ data itself are provided in order to avoid the missed detection and rise of TA flags and error flags that occur as a result of the difficulty of setting the slice in an optimal manner as described above.

Besides the abovementioned TA, causes of error seen in cases where NRZ data is reproduced from an analog read waveform include S/N degradation caused by random noise, a decrease in the amplitude of the read signal caused by defects on the disk, offset that occurs during data writing, fluctuations in the amplitude and asymmetry of the waveform, and characteristic variations in the read signal waveform caused by fluctuations in the operating environment or the like. In the case of all of these errors arising from various causes, the probability that the same position will be erroneously reproduced in exactly the same way each time in cases where the portion of the magnetic disk in which errors have been generated is repeatedly read and the analog signal thus obtained is restored to NRZ data is extremely low. Specifically, it may be said that there is a high probability that portions that are reproduced in the same way each time are correct data.

Accordingly, a plurality of NRZ data obtained by reading data recorded on a plurality of magnetic disks are stored, these data are compared in byte units, portions that are reproduced as the same data every time or a plurality of times are judged to be correct data, portions that are reproduced as different data every time or a plurality of times are judged to be portions in which errors have occurred, and the positions of these portions are used as erasure pointers for erasure correction.

DESCRIPTION OF THE PREFERRED EMBODIMENTS

Figure 1:
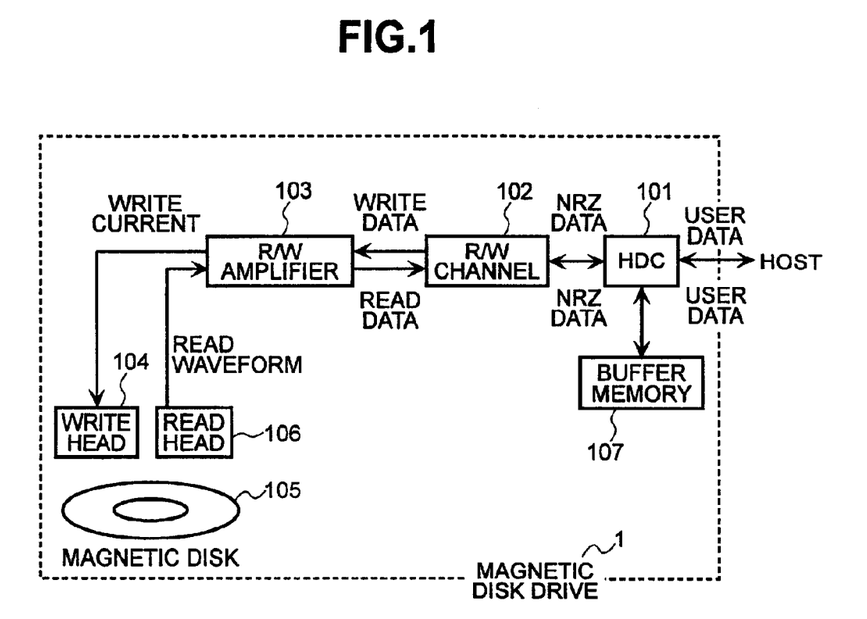
FIG. 1 is a diagram which shows the general construction of a magnetic disk drive.

FIG. 1 shows the flow of data writing and reading in a general storage device (magnetic disk drive) using a magnetic disk as a data recording medium. The flow of data writing is as follows:

First, the host sends user data to a magnetic disk drive 1. The magnetic disk drive 1 that has received the user data prepares an ECC code for the purpose of error detection and correction and a CRC code used for correction confirmation on the basis of the user data by means of an HDC (hard disk controller) 101 that has a signal processing circuit. Then, the HDC 101 transfers the NRZ data to which these codes have been added to an R/W channel 102. The R/W channel 102 performs processing such as encoding, scrambling, precoding, write pre-conversion and the like on the NRZ data that has been transferred from the HDC 101, converts the NRZ data into write data that is suitable for magnetic recording, and transmits this data to an R/W amplifier 103. The R/W amplifier 103 produces a write current in accordance with the write data. A write head 104 records the data as magnetization inversion patterns on a magnetic disk 105 in accordance with this supplied write current.

The reading of the data recorded on the magnetic disk 105 is accomplished as follows: an analog read waveform read out by a read head 106 is first amplified by the R/W amplifier 103. Then, the amplified analog signal is sent to the R/W channel 102. The R/W channel 102 reproduces the NRZ data, which is digital data, from the analog signal, and sends this data to the HDC 101. The HDC 101 reproduces the user data from the NRZ data. When the user data is reproduced from the NRZ [data], a judgement as to whether or not the reproduced user data is correct is made using the ECC code that was added at the time of writing. In cases where errors are present, the error positions are detected, and the errors are corrected. A further judgement as to whether or not the corrected user data is correct or not is made using the CRC code, and if the data is judged to be correct, this user data is transferred to the superior host.

Furthermore, the user data that is transferred from the host to the HDC 101 at the time of writing, and the user data that is reproduced by the HDC 101 at the time of reading, are usually transferred to the R/W channel 102 or host via the HDC 101 after being temporarily accumulated in a buffer memory 107. Moreover, the use of a composite head which is integrated using an inductive element in the write head 104 and an MR (including GMR or TMR) in the read head 106 is a recent trend.

A Reed-Solomon code is generally used as the ECC code. The error detection and correction procedure using a Reed-Solomon code is as follows: first, a syndrome is produced from the read data. An error-locator polynomial is then produced from this syndrome. Next, an error-magnitude polynomial is produced from the error-locator polynomial. Then, a chain search is performed for the error-locator polynomial in order to detect the error position. Finally, the error magnitude is calculated by evaluating the error-magnitude polynomial in the error-locator polynomial. In cases where data is written with a (2×n) byte Reed-Solomon code added [to the data], the positions of errors generated in the read data up to a maximum of n bytes can be specified, and these errors can be corrected.

Figure 4:
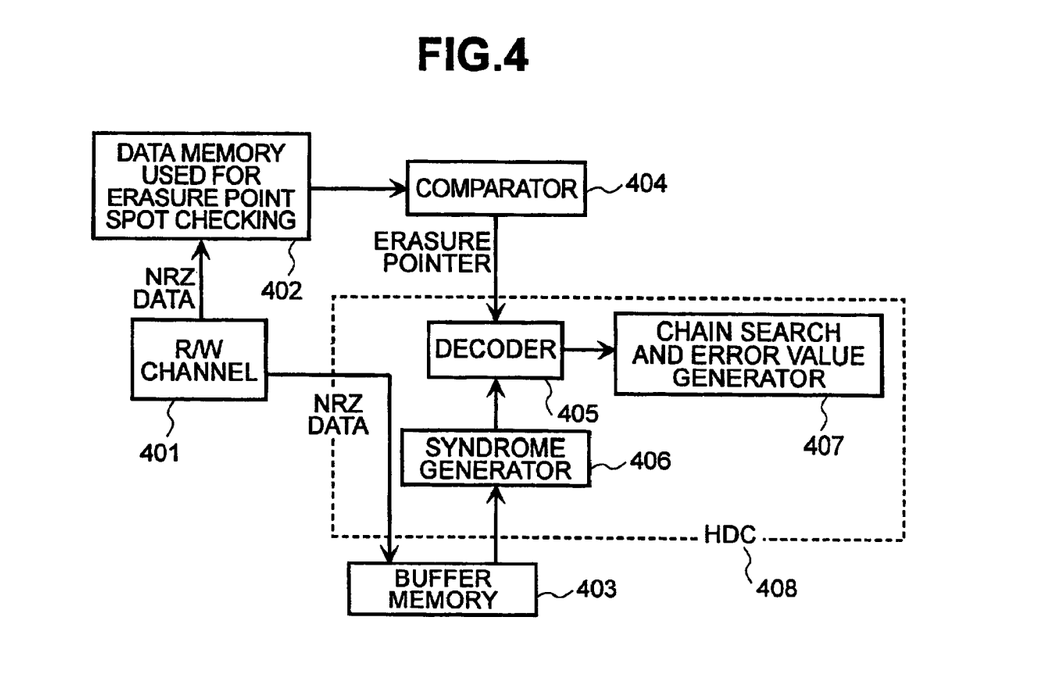
FIG. 4 is a diagram which shows the construction of the error correction system in a case where there is a data memory used for erasure spot checking that is separate from the buffer memory.

FIG. 4 shows the construction of the error detection/correction system of the present invention. The area surrounded by a broken line in FIG. 4 is provided as a function of the HDC 408. The read head 106 repeatedly reads certain sectors on the magnetic disk a plurality of times, and outputs a read analog waveform. The R/W channel 401 restores the input waveform to a plurality of NRZ data. Then, the data memory 402 used for erasure spot checking stores these NRZ data. Furthermore, among these data, one or more NRZ data re stored by a buffer memory 403.

The comparator 404 extracts a plurality of NRZ data from the data memory 402 used for erasure spot checking, and compares these [data] byte by byte. In byte positions meeting conditions described later in FIGS. 6 and 7, the comparator 404 considers that an error has occurred and issues an erasure pointer, and this erasure pointer is sent to the decoder 405. Alternatively, the comparator 404 may consider that an error has occurred in byte positions where all of the values of a plurality of NRZ data are different, and may issue an erasure pointer which is sent to the decoder 405, or, in cases where the values of a predetermined number of NRZ data or greater are different, the comparator 404 may consider that an error has occurred in such byte positions.

The syndrome generator 406 produces a syndrome from one NRZ datum or from one of a plurality of NRZ data stored in the buffer memory 403, and sends this syndrome to the decoder 405. The decoder 405 produces an erasure-locator polynomial from the erasure pointer that is sent from the comparator 404, and also produces a modified error-locator polynomial and error-magnitude polynomial from the syndrome and the erasure-locator polynomial. Then, the decoder 405 produces an error-magnitude polynomial o(x) from the modified error-locator polynomial. Finally, the chain search and error position generator 407 detects the error position by performing a successive substitution search of the modified error-locator polynomial, and calculates the error magnitude by evaluating the error-magnitude polynomial in the modified error-locator polynomial. By using this modified error-locator polynomial, it is possible to correct errors up to a maximum of (2×n) bytes in cases where data is written with a (2×n) byte Reed-Solomon code added, in the same manner as when erasure correction is used.

Furthermore, since the capacity for specifying error positions is superior to that of conventional methods, correct user data can be returned to the host by specifying the error positions and combining [this technique] with erasure correction, even in cases where a retry is unavoidable in conventional methods, or in cases where a number of errors that prevents the reading of data is generated even though a retry is performed.

Figure 5:
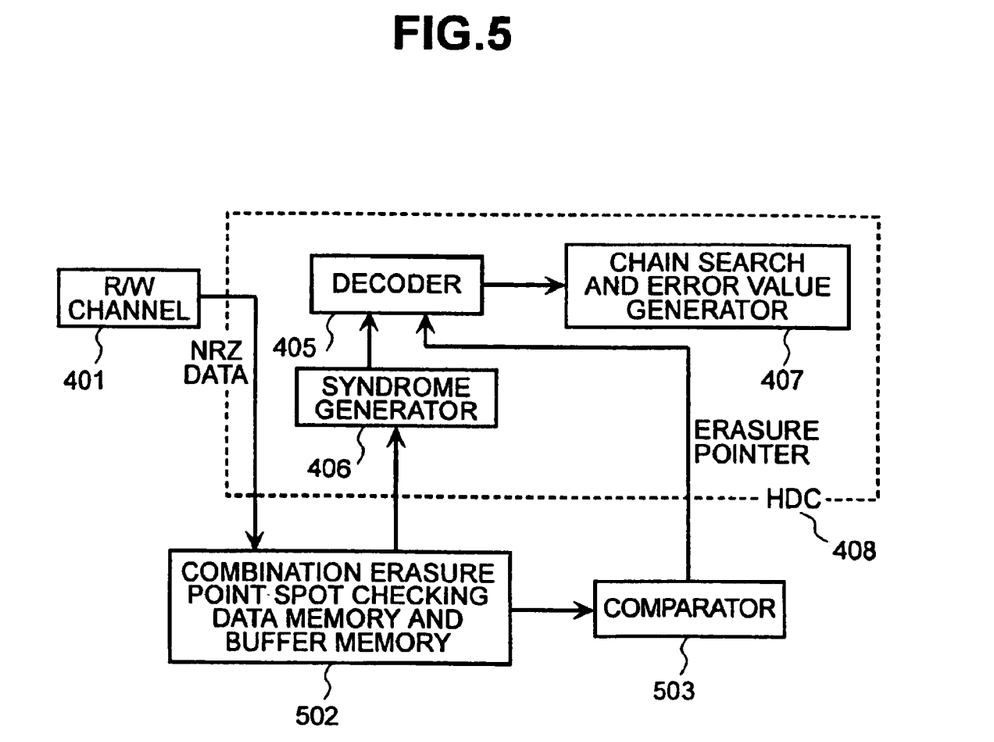
FIG. 5 is a diagram which shows the construction of the error correction system in a case where the data memory used for erasure spot checking is also used as a buffer memory.

Furthermore, as is shown in FIG. 5, a buffer memory and a data memory used for erasure spot checking may be used in common. In this case, all of the plurality of NRZ data that are reproduced by the R/W channel are stored in a combination erasure spot checking memory and buffer memory 502. Furthermore, in regard to the data comparing function, it is not absolutely necessary to provide a dedicated hardware comparator 404 or 503 as shown in FIG. 4 or FIG. 5; such a comparison may also be handled by software using a personal computer.

Furthermore, since the error correction of the present invention requires that data be read a plurality of times, this error correction requires more time than error detection and correction using an ordinary Reed-Solomon code. Accordingly, when the present invention is applied to an actual product, it is envisioned that the method of the present invention will be performed in cases where erasure correction or error detection and correction using general Reed-Solomon code is first performed, and it proves impossible to accomplish error detection and correction by these methods.

Figure 6:
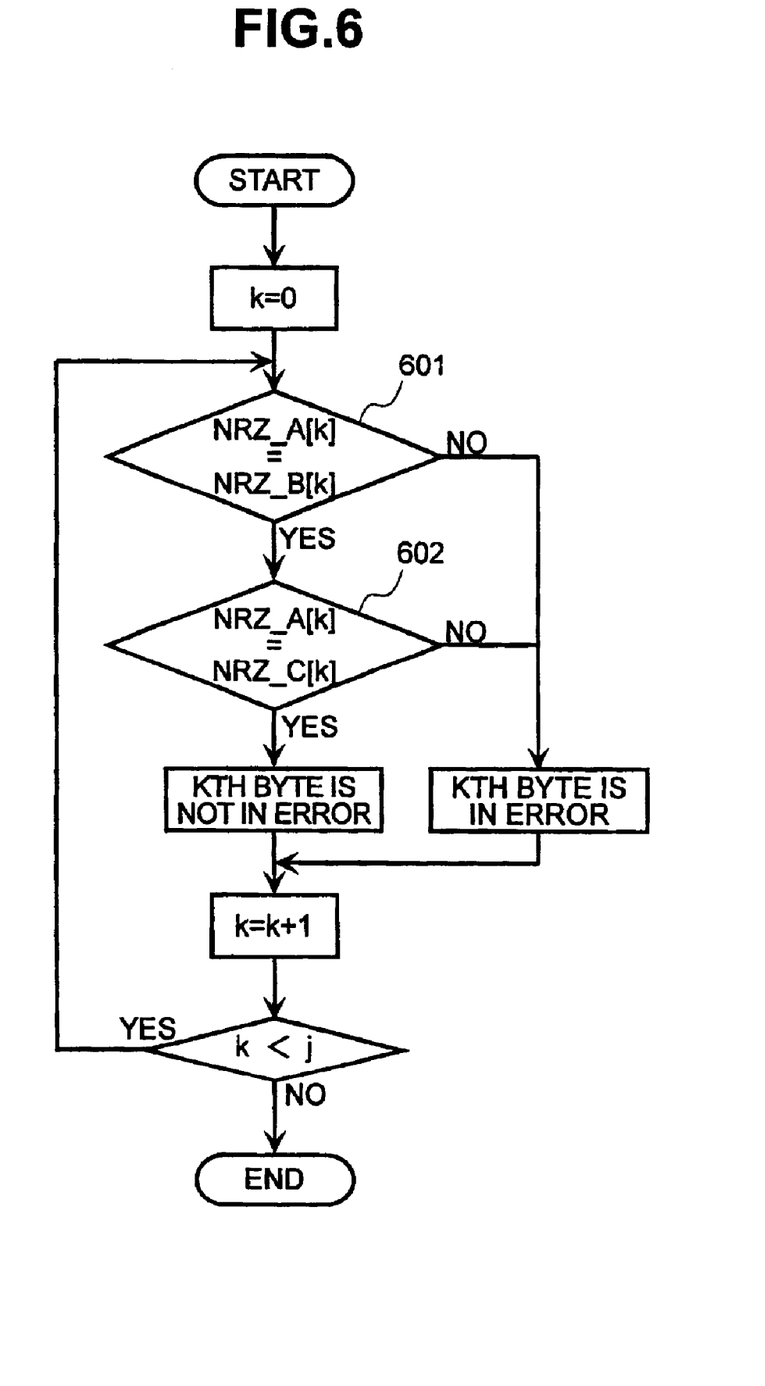
FIG. 6 is a flow chart which shows the procedure whereby it is judged that an error has occurred in the byte position if even one set of a plurality of NRZ data shows a different value.
Figure 7:
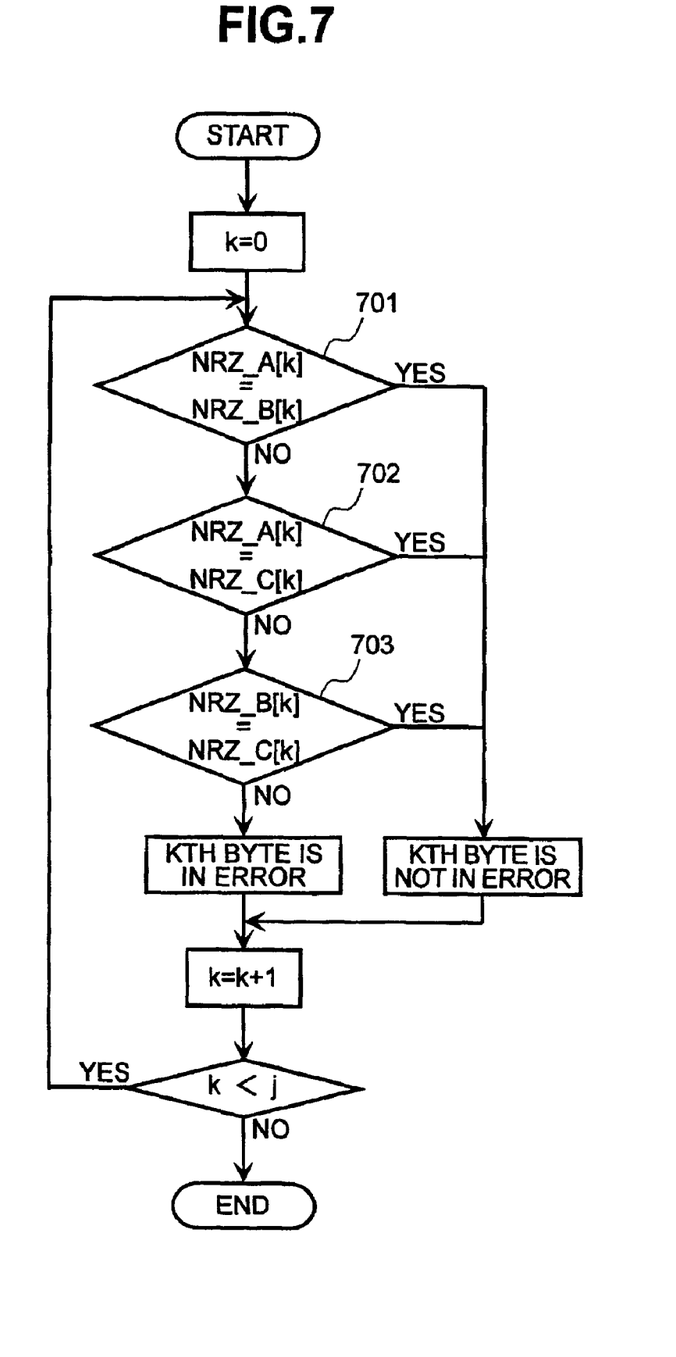
FIG. 7 is a flow chart which shows the procedure whereby it is judged that an error has occurred in the byte position if all of the values of a plurality of NRZ data are different.

FIGS. 6 and 7 show the concrete flow of erasure pointer detection processing performed in the comparators shown in FIGS. 4 and 5. Here, a procedure in which the erasure point is determined from NRZ data obtained by reading a certain sector three times is shown as an example. Furthermore, in FIGS. 6 and 7, j indicates the number of bytes of data in one sector. Here, the number of times that the same sector is read in order to judge the positions in which errors have been generated is set at three times; however, there are no particular restrictions on this number of times. Although this depends on the manner in which an erasure pointer is issued, the locations at which errors are generated can [generally] be specified as long as reading is performed at least twice, and specification becomes easier as the number of times that reading is performed is increased. Accordingly, it is desirable that the system be arranges so that the number of times that reading is performed can be altered, e.g., so that the user can set the number of times that reading is performed from the outside, or so that further reading is performed in cases where an erasure pointer cannot be issued in the case of the initially set number of times that reading is performed.

FIG. 6 shows the processing that is performed in cases where it is considered that an error has occurred in byte positions other than byte positions in which the values of all of the plurality of NRZ data are the same, and an erasure pointer is accordingly issued.

First, k is set so that k=0, and detection is performed in order from the leading byte of the sector. In step 601, the NRZ data NRZ_A obtained by the first reading and the NRZ data NRZ_B obtained by the second reading are compared. If the results of this comparison show a difference, it is judged that an error has occurred in this byte, and the processing proceeds to the next byte.

In cases where the results of the comparison show that [the data is] the same, the NRZ data NRZ_A obtained by the first reading and the NRZ data NRZ_C obtained by the third reading are compared in step 602. If the results of this comparison show a difference, it is similarly judged that an error has occurred in this byte, and the processing proceeds to the next byte. If the results of the comparison show that [the data] coincides in step 602 as well, it is judged that no error has occurred in this byte, and k is increased by 1 so that the processing proceeds to the next byte.

The byte positions in which errors have occurred can be ascertained, and erasure pointers can be determined, by performing this processing until k is larger than j, i.e., by performing the processing in all of the bytes.

In this system, it is judged that an error has occurred in cases where a different value is read even one time among the data that is compared a plurality of times; accordingly, the number of errors itself may be increased compared to a case in which the data is read [only] one time. However, even if the number of errors is increased, the locations of the errors can be specified, so that error correction is possible. Specifically, in cases where a (2×n) byte Reed-Solomon code is utilized, conventional methods utilize n bytes for the specification of error locations, so that only the remaining n bytes can be corrected. In the present invention, however, the locations can be specified; accordingly, correction of more than n bytes (n+the bytes whose locations have been specified) is possible.

FIG. 7 shows the processing used in cases where it is considered that an error has occurred in byte positions in which all of the values of a plurality of NRZ data are different, and an erasure pointer is issued accordingly.

In this processing system as well, k is initially set so that k=0, and detection is performed in order from the leading byte of the sector. The NRZ data NRZ_A obtained by the first reading and the NRZ data NRZ_B obtained by the second reading are compared in step 701, the NRZ data NRZ_A obtained by the first reading and the NRZ data NRZ_C obtained by the third reading are compared in step 702, and the NRZ data NRZ_B obtained by the second reading and the NRZ data NRZ_C obtained by the third reading are compared in step 703.

Then, in cases where the respective NRZ data do not agree in any of these steps, it is judged that an error has occurred in the byte in question. As in the case of FIG. 6, this processing is performed until k is larger than j; i.e., the processing is performed in all of the bytes.

This system differs from the embodiment shown in FIG. 6 as follows: namely, if the same values appear in any of the readings, the value in question is judged to be correct. Accordingly, even in cases where a number of errors exceeding the correction capacity is generated in one reading, the error locations where it appears that misreading has occurred are reduced as the number of readings is increased, so that error correction can be accomplished after reading has been performed a plurality of times.

As a result of this special feature, the embodiment shown in FIG. 7 is effective not only when used alone, but also when used in combination with the embodiment shown in FIG. 6. The embodiment shown in FIG. 7 may also be performed in cases where the number of errors still exceeds the correction capacity even though error pointers have first been specified using the embodiment shown in FIG. 6, so that correction is impossible. Furthermore, in cases where the number of times that reading is performed is increased, a system in which it is judged that an error has not occurred in the position in question if the values of the data are the same, not in all of the readings, but in a certain number of the readings (e.g., a majority of the readings, almost all of the readings or the like), may be used as a system that combines the system of FIG. 6 and the system of FIG. 7. In other words, this system in which it is judged that an error has occurred in the byte position in question if the values are different in several digital data among a plurality of digital data. For example, in this method, if the same value is obtained in eight of ten readings, it is judged that this value is a correct value, and that the error is located in another position.

Here, if [i] the number of bytes of added ECC is (2×N) bytes, [ii] the number of bytes specifying error pointers is (2×M) bytes (M≦N), and [iii] the number of erroneous bytes among those specified is L bytes, then the number of bytes that can be corrected is (N+M−L) bytes.

Since the number of bytes L cannot be determined in advance, it is assumed in the present invention that L=0, and reading is performed a specified number of times. Then, at a point in time at which (N+M)≦(2×N), i.e., a point in time at which M≦N, an error check is performed using a correction confirmation code CRC that is added to the data together with the ECC following correction, and a judgement is made as to whether or not the corrected data is correct. In cases where the results of the check made by this CRC indicate that the data is erroneous, it is considered that (N+M−L)≧(2×N), and reading is performed a further specified number of times. Then M'(>M) error pointers are determined, and error correction and checking by means of the [abovementioned] CRC are performed again. In the present invention, a maximum of (2×N) error corrections can be performed by repeating this routine.

By way of comparison, in cases where a conventional error correction method is used, i.e., in the case of an error correction method in which pointers are not specified, M=L=0, and there is correction capacity of only N bytes. Furthermore, in cases where correction is performed with the error pointers hypothetically set, the number of bytes that can be corrected is (N+M−L) bytes as in the present invention; however, L is larger than in the present invention, so that the processing time required to reach a point where (N+M−L)≧(2×N) is greater than in the present invention.

Figure 8:
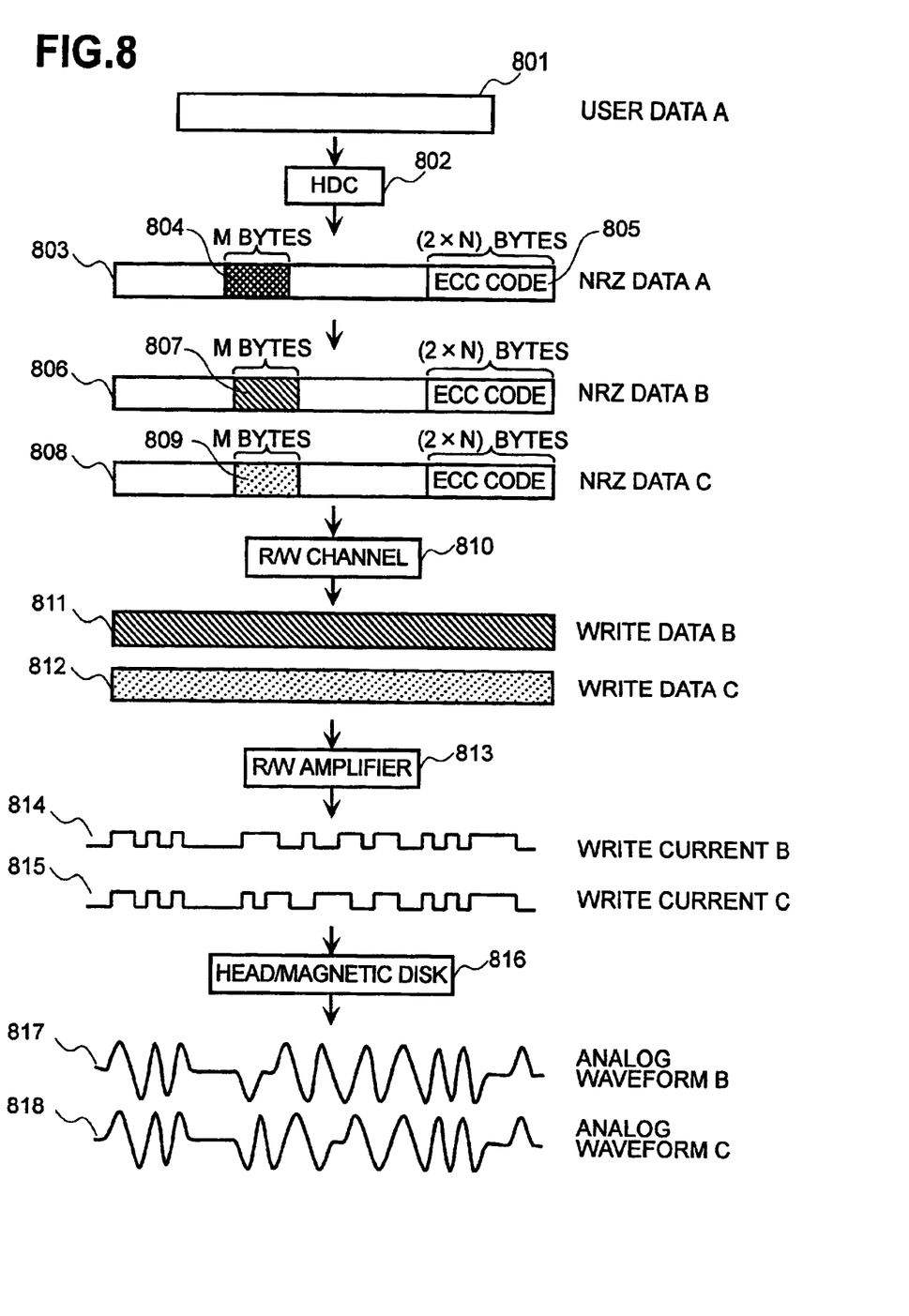
FIG. 8 is a diagram which illustrates the procedure that is used to prepare confirmation data.

Next, the method that is used to confirm the results of correction performed by the present invention will be described with reference to FIG. 8. Here, the user data that is provided from the host is designated as user data A 801; when the user data A is provided, a Reed-Solomon code is added by the HDC 802, and the NRZ data that is sent to the R/W channel is designated as NRZ data A 803. The NRZ data A 803 contains a (2×n) byte Reed-Solomon code 805. Furthermore, in FIG. 8, the Reed-Solomon code is indicated as an ECC code.

Next, NRZ data B 806 and NRZ data C 808 which have data values that differ from the NRZ data A 803 by m bytes 804, 807 and 809 are prepared on the basis of the NRZ data A 803. Here, m is such that n<m≦(2×n), so that the portions 804, 807 and 809 consisting of m bytes that differ from the original NRZ data A 803 in the NRZ data B 806 and NRZ data C 808 have the same byte positions as counted from the leading end of the data. Furthermore, the NRZ data B 806 and NRZ data C 808 must also be data differing from each other by portions equal to m bytes. Furthermore, in FIG. 8, the portions 803, 807 and 809 consisting of m bytes are shown in a single location; however, as long as the total number of bytes is m bytes, these portions may also be divided into a plurality of portions.

Next, the write data in a case where the NRZ data B 806 and NRZ data C 808 are input into the R/W channel 810 are respectively designated as write data B 811 and write data C 812. Furthermore, the write current waveforms that are used when the write data B 811 and write data C 812 are sent to the R/W/ amplifier 813 are respectively designated as a write current waveform B 814 and write current waveform C 815. Moreover, the analog waveforms that are obtained when the magnetization inversion formed by the writing of the data on the magnetic disk 816 by means of these write current waveforms is read by the read head are respectively designated as an analog read waveform B 817 and analog read waveform C 818.

Furthermore, in the respective processes of producing the write data from the NRZ data, producing the write current waveforms from the write data, producing the magnetization inversion from the write current waveforms and producing the analog read waveforms from the magnetization inversion, the write data and analog read waveforms are produced so that the data contains no missing bits, rising of bits, timing jitter or amplitude abnormalities.

In cases where the abovementioned analog read waveform B 817 and analog read waveform C 818 are supplied to a read circuit in which only correction by means of an ordinary Reed-Solomon code is performed, both of these waveforms contain errors exceeding n bytes; accordingly, correct user data cannot be reproduced even if these analog read waveforms are supplied repeatedly or continuously. Furthermore, the analog read waveform B 817 and analog read waveform C 818 which are prepared by adding alterations to the NRZ data do not contain TA or magnetic recording abnormalities; accordingly, TA flags or error flags cannot be issued. Consequently, even if these input waveforms are supplied to a playback system in which erasure correction is performed using flags issued by the R/W channel, correct user data cannot be reproduced.

However, in the case of a playback system in which erasure correction is performed utilizing the present invention, the NRZ data B and NRZ data C reproduced from the analog read waveform B and analog read waveform C by the R/W differ by m bytes, so that it is known that these portions are portions in which errors have occurred. Accordingly, erasure connection is made possible by supplying this information to the decoder as erasure pointers, so that correct user data, i.e., user data A 801, can be reproduced.

Here, furthermore, a case in which erasure points were determined from two NRZ data, which is the simplest example, was described. However, in cases where erasure points are determined from three or more NRZ data as well, a plurality of NRZ data can be prepared by the same method as that used to prepare the NRZ data B 806 and NRZ data C 808 from the NRZ data A 801, and the erasure correction operation can be checked by inputting these data into the playback system.

By using the present invention, it is possible to eliminate the erroneous detection of TA and errors and the missed detection that occur when TA flags or error flags are used, so that the positions in which errors occur can be correctly specified. Accordingly, more effective erasure correction can be accomplished, and even data that cannot be read using conventional methods can be correctly read.

What is claimed is:

1. An error correction method for a storage device comprising the steps of:

performing a first error detection and correction which does not need to read a data a plurality of times during reproduction of the data in order to detect or correct an error in the data;

if the first error detection and correction cannot detect or correct an error in the data, then reading a sector a plurality of times during reproduction of data recorded on a recording medium;

storing a plurality of data which is obtained by said reading;

comparing data values of bytes located in the same location among said stored plurality off data;

judging whether an error has occurred in said data in ascertained positions where said values differ; and correcting errors on the basis of these ascertained positions.

2. The error correction method for a storage device according to claim 1, wherein errors are corrected using erasure correction on the basis of said ascertained positions.

3. The error correction method for a storage device according to claim 1, further comprising the steps of:

reading said sector three or more times;

comparing the values of the data positioned in said same location each time;

judging whether an error has occurred in the data in ascertained positions where these values differ each time; and correcting errors on the basis of said ascertained positions.

4. The error correction method for a storage device according to claim 3, wherein errors are corrected using erasure correction on the basis of said ascertained positions.

5. The error correction method for a storage device according to claim 1, further comprising the steps of:

reading said sector three or more times;

comparing the values of the data positioned in said same location each time;

judging whether an error has occurred in the data in ascertained positions where these values differ even one time; and correcting errors on the basis of said ascertained positions.

6. The error correction method for a storage device according to claim 5, wherein errors are corrected using erasure correction on the basis of said ascertained positions.

7. An error correction method for a storage device comprising the steps of:

performing a first error detection and correction which does not need to read a data a plurality of times during reproduction of the data in order to detect or correct an error in the data;

if the first error detection and correction cannot detect or correct an error in the data, then reading a sector a plurality of times during reproduction of data;

storing a plurality of digital data produced by conversion from the signal thus obtained;

comparing values of data located at the same location for each byte from the leading end of this stored plurality of digital data; and judging whether an error has occurred in the data located in byte positions where the values differ, and storing the resulting error information.

8. The error correction method for a storage device according to claim 7, wherein errors are corrected using erasure correction on the basis of said positions.

* * * * *